United States Patent [19]
Blair

[11] Patent Number: 5,925,923
[45] Date of Patent: *Jul. 20, 1999

[54] MERGED SINGLE POLYSILICON BIPOLAR NPN TRANSISTOR

[75] Inventor: Christopher S. Blair, San Jose, Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/803,122

[22] Filed: Feb. 20, 1997

[51] Int. Cl.$^6$ .................. H01L 27/082; H01L 27/102; H01L 29/70

[52] U.S. Cl. .................. 257/587; 257/588; 257/592

[58] Field of Search .................. 257/576, 587, 257/588, 592, 593

[56] References Cited

U.S. PATENT DOCUMENTS

| | | | |
|---|---|---|---|
| 5,187,554 | 2/1993 | Miwa | 257/587 |
| 5,424,572 | 6/1995 | Solheim | 257/588 |

*Primary Examiner*—Wael M. Fahmy
*Attorney, Agent, or Firm*—Limbach & Limbach L.L.P.

[57] ABSTRACT

A merged single polysilicon bipolar NPN transistor, rather than using separate isolation islands for emitter-base and collector contacts, utilizes a single isolation island. This significantly reduces device area because elimination of the second isolation island used in conventional designs reduces the N+ sink to NPN spacing. Buried layer and isolation layer processing proceed in the conventional manner. At sink mask, however, the mask is sized to uncover one end of the main device active region and a sink implant is performed. At base mask, the sink implant remains covered, rather than being exposed as in the conventional flow. At silicide exclusion, the oxide spacer layer is patterned to exclude silicide from the area above the sink implant region.

2 Claims, 5 Drawing Sheets

MERGED SINGLE POLYSILICON BIPOLAR NPN TRANSISTOR

BACKGROUND OF THE INVENTION

1. Field of the Invention

The present invention relates to integrated circuit elements and, in particular, to a merged single polysilicon bipolar NPN transistor that, instead of utilizing separate isolation islands for emitter-base and collector contacts, utilizes a single isolation island, thereby significantly reducing device area.

2. Discussion of the Related Art

Conventional bipolar NPN transistors require two separate active areas: one for the main device, i.e. the vertical emitter-base-collector NPN junctions, and another for the sink contact to the NPN collector. For many fabrication technologies, implementation of these two areas requires a significant amount of silicon area because the isolation processes used in these technologies cannot readily be scaled. For example, in some technologies, if the spacing between isolation islands is reduced to too small a distance, then the field oxide does not grow properly, resulting in silicon crystal defects.

Other types of isolation processing, such as deep trench isolation, can greatly reduce device area, but are very complex.

FIGS. 1A–1E show a general process flow for fabricating a conventional vertical bipolar NPN transistor. FIG. 1A shows an N+ buried layer 102 formed in a silicon substrate 100. Field oxide isolation regions 104, including a separate oxide isolation region 104', define two separate active regions: an N- region 106 in which the vertical emitter-base-collector junctions of the main NPN device will be formed and an N+ region 108 which serves as the sink contact to the NPN collector.

Referring to FIG. 1B, following deposition of a layer 110 of polysilicon, a base implant mask is defined to expose the poly layer 110 above the N- active region 106. P-type dopant is then implanted into the exposed portions of the poly layer 110, the dopant is outdiffused from the poly layer 110 into the underlying N- active region 106 in a thermal step, and the structure is annealed to form P- base region 112. The base mask is then stripped and N+ and P+ poly implant modules are sequentially performed (the order is not critical), resulting in the structure shown in FIG. 1B.

Referring to FIG. 1C, the poly layer 110 is then masked and etched to defined raised P+ poly base contact region 114, N+ poly emitter region 116 and N+ poly sink contact region 118. A thermal drive-in step is then performed to diffuse N-type dopant from N+ poly emitter region 116 into base region 112 to form emitter contact 120.

As shown in FIG. 1D, following a masked link base implant, a layer of spacer oxide is deposited and etched back to form oxide sidewall spacers 122 on the poly regions 114, 116 and 118. A P+ implant is then performed to complete the extrinsic base regions. A final anneal step is then performed to activate the dopants and salicide contact layers 124 are provided, resulting in the structure shown in FIG. 1E.

SUMMARY OF THE INVENTION

The present invention uses a single active isolation area to form a single polysilicon bipolar NPN transistor. This results in significantly reduced device size because elimination of the second isolation island utilized in conventional designs reduces the N+ sink to NPN spacing. Buried layer and isolation layers proceed in the conventional manner. At sink mask, however, the mask is sized to uncover active silicon at one end of the main device region for the sink implant. At base mask, the sink region formed in the main device active region remains covered, rather than being exposed as in the conventional flow. At silicide exclusion, the spacer oxide is patterned to exclude silicide from the area above the sink implantation, plus a significant margin, to maintain BVcbo at conventional values.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

A process flow for fabricating a merged single polysilicon bipolar NPN transistor in accordance with the present invention will now be described in conjunction with the partial cross-sectional drawings provided in FIGS. 2A–2E. While no specific process parameters are provided, those skilled in the art will appreciate that the concepts of the invention are applicable regardless of these parameters, which will differ depending upon the specific integrated circuit structure under manufacture.

Figure 1A:
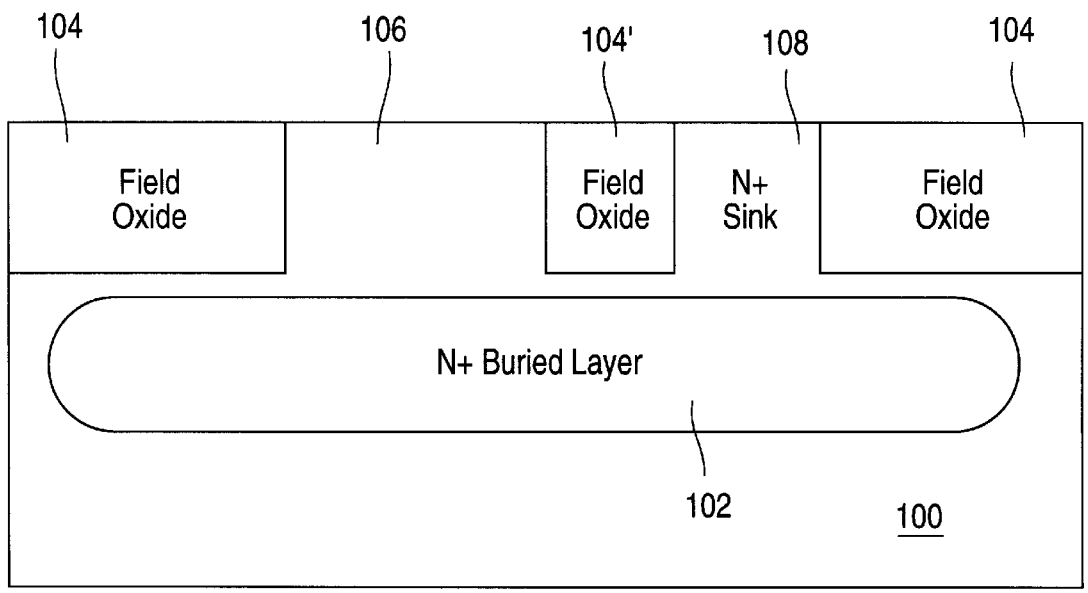
FIGS. 1A–1E are cross-sectional drawings illustrating a sequence of steps for fabricating a conventional bipolar NPN transistor.
Figure 1B:
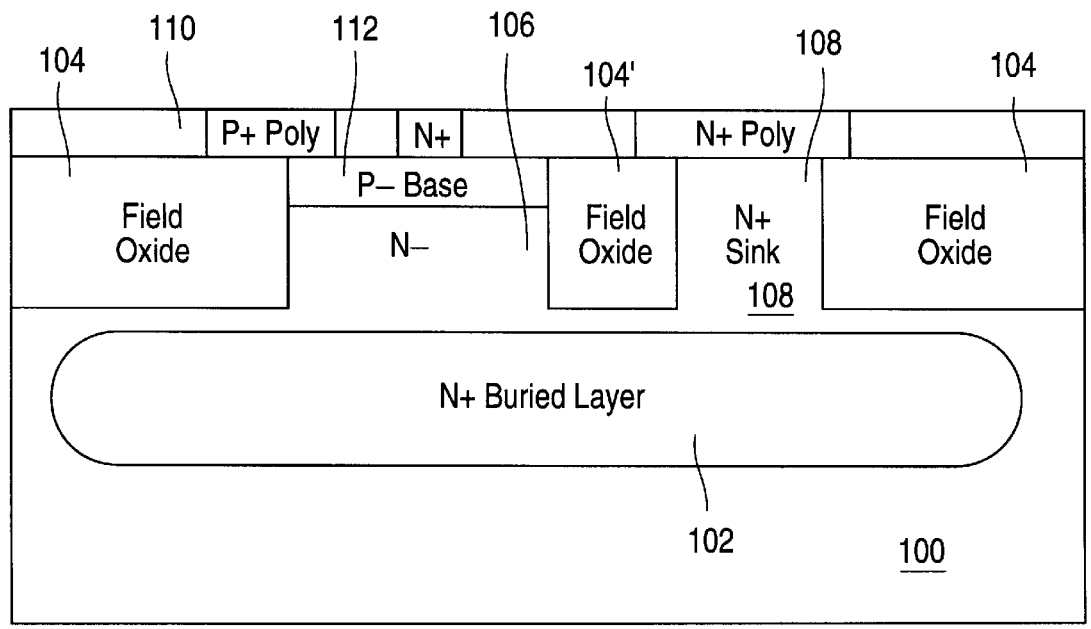
Figure 1C:
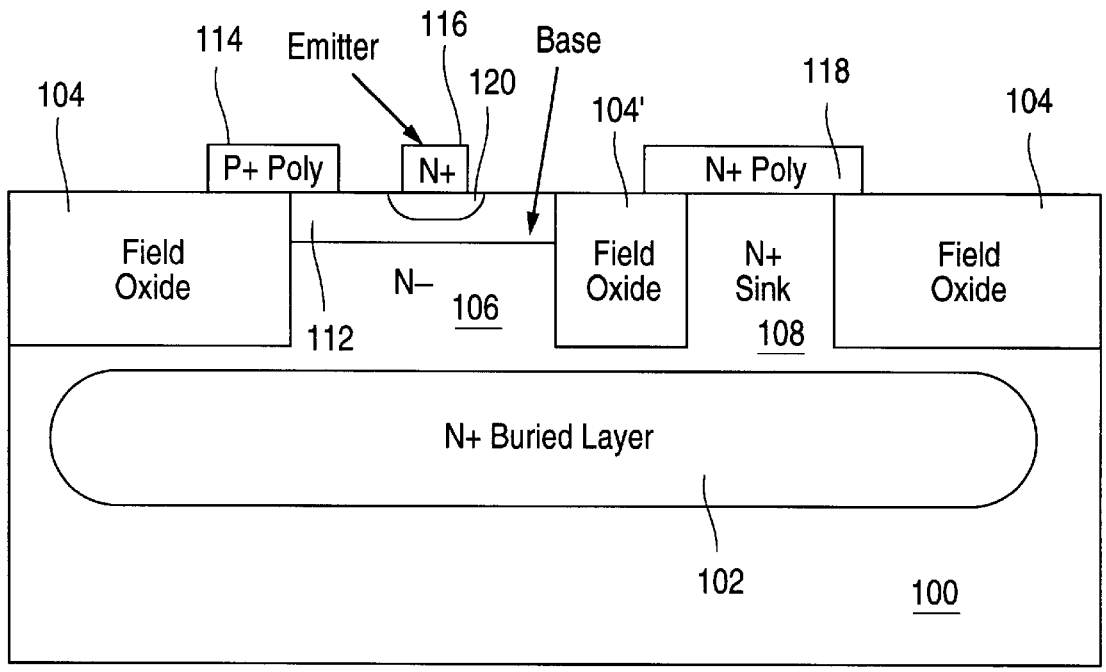
Figure 1D:
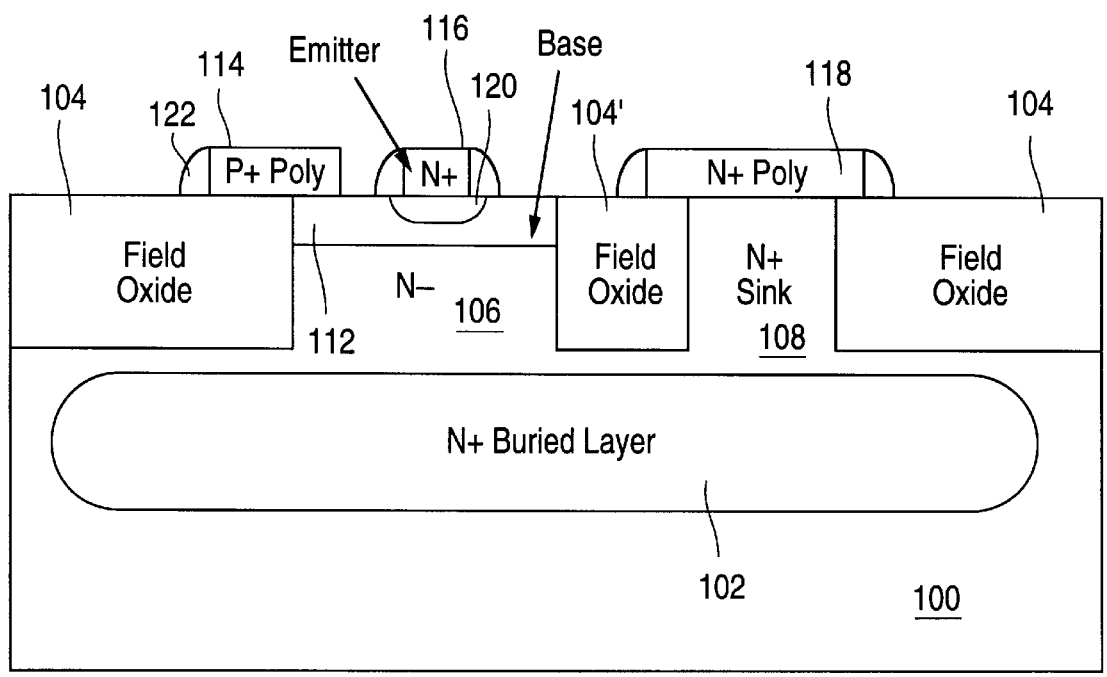
Figure 1E:
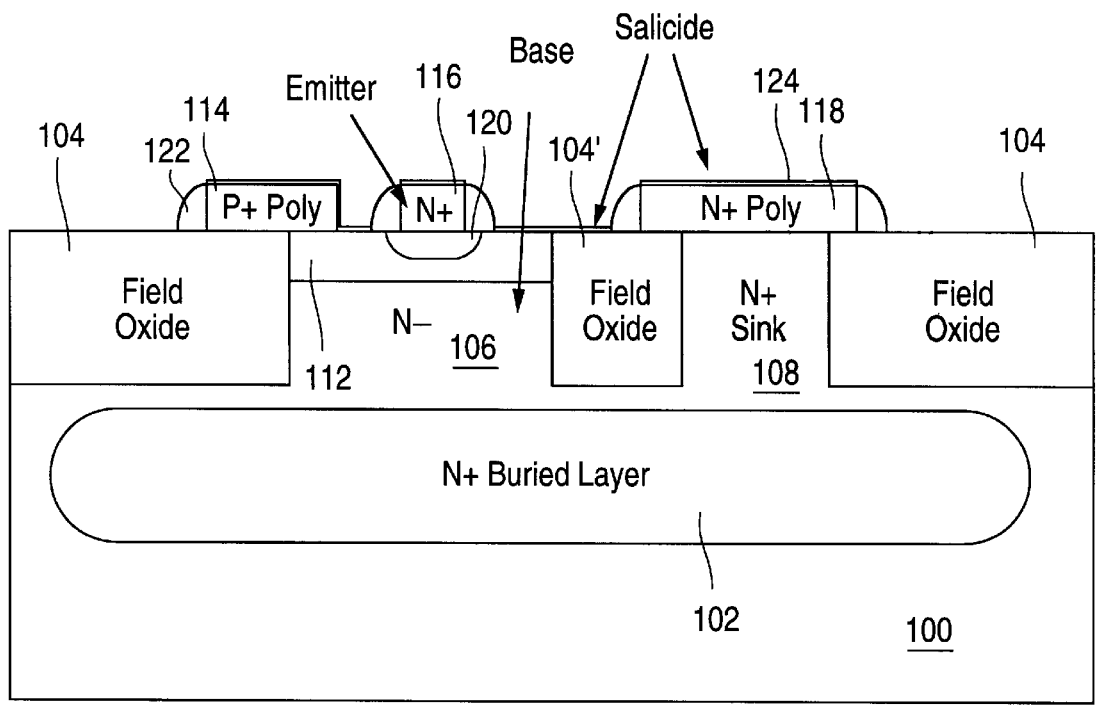
Figure 2A:
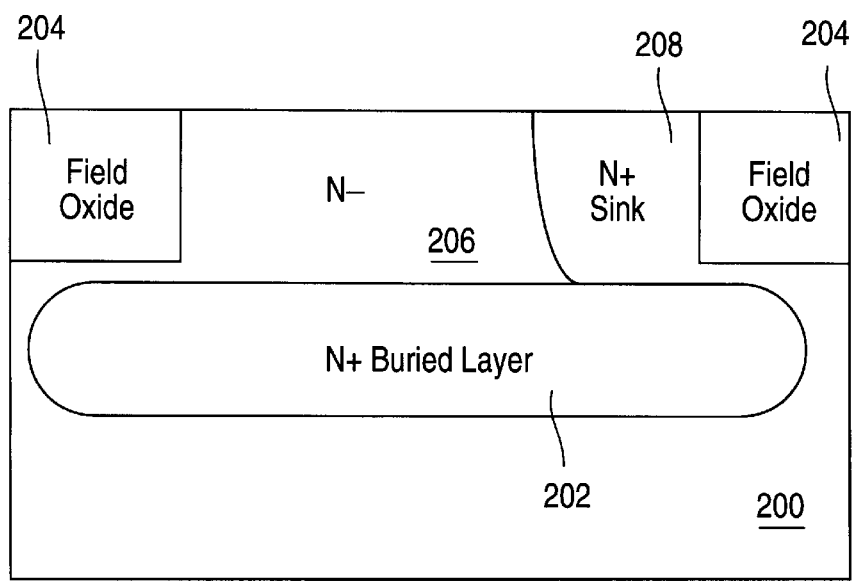
FIGS. 2A–2E are cross-sectional drawings illustrating a sequence of steps for fabricating a merged single polysilicon bipolar NPN transistor in accordance with the concepts of the present invention.

Referring to FIG. 2A, a process flow in accordance with the present invention proceeds in the conventional manner through formation of a N+ buried layer 202 in a silicon substrate 200 and formation of oxide isolation regions 204 to define an N- active device region 206. It is noted that the FIG. 2A structure does not include a second isolation island to define separate main device active regions and collector contact sink regions. Rather, in accordance with the invention, the sink mask is defined to expose a portion of the N- active device region 206 at one end of the region 206, illustrated in FIG. 2A as directly adjacent to the "right-hand" field oxide isolation region 204. N-type dopant is then implanted into the exposed portion of N- active device region 206 to form an N+ sink region 208, illustrated in FIG. 2A as extending to the N+ buried layer 202.

Figure 2B:
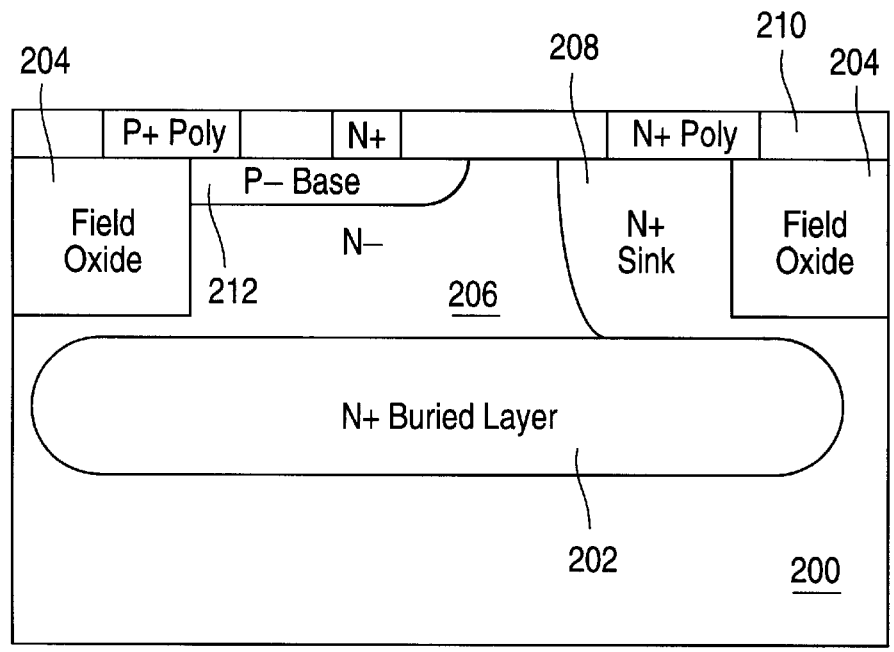

Referring to FIG. 2B, following deposition of a layer 210 of polysilicon, a base mask is defined to expose a region of polysilicon layer 210 overlying a second portion of the N- active device region 206. P-type dopant is then implanted into the exposed region of the polysilicon layer 210 and outdiffused from the poly layer 210 into the underlying N- active region 206 in a thermal step to define a P- base region 212. Note that, at this base mask step, the N+ sink region 208 remains protected, rather than being exposed as in the case of the conventional FIGS. 1A–1E process flow. The base mask is then stripped and N+ and P+ poly implant modules are sequentially performed, resulting in the structure shown in FIG. 2B. As in the conventional flow, the order of the N+ and P+ implants is not critical.

Figure 2C:
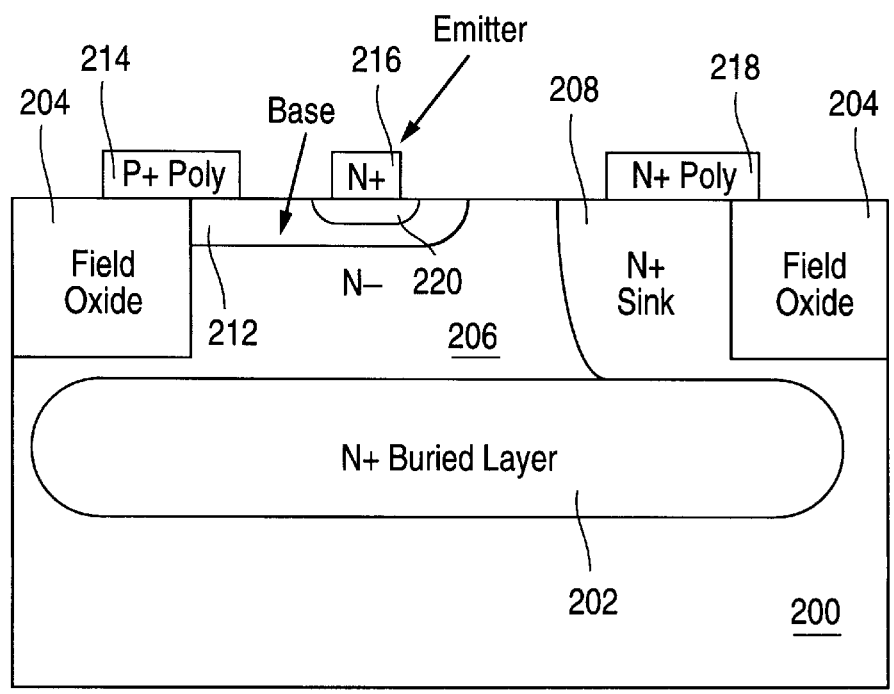

Referring to FIG. 2C, the poly layer 210 is then masked and etched to define a raised P+ poly base contact region 214, an N+ poly emitter region 216, and an N+ poly sink contact region 208. A thermal drive-in step is then performed to outdiffuse N-type dopant from the N+ poly emitter region into the base region 212 to form an emitter contact 220.

Figure 2D:
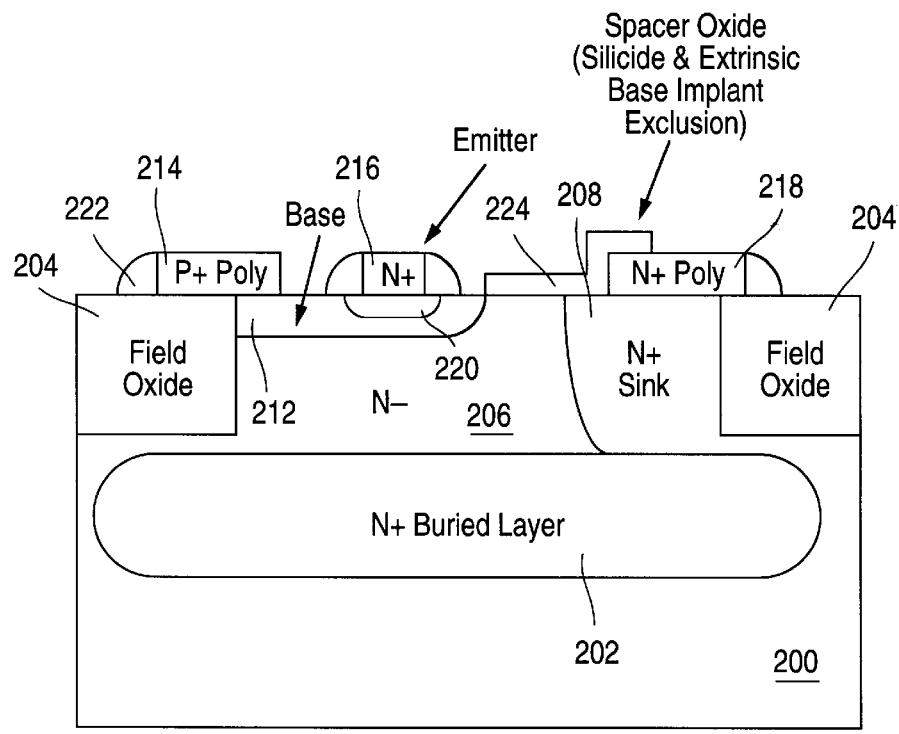
Figure 2E:
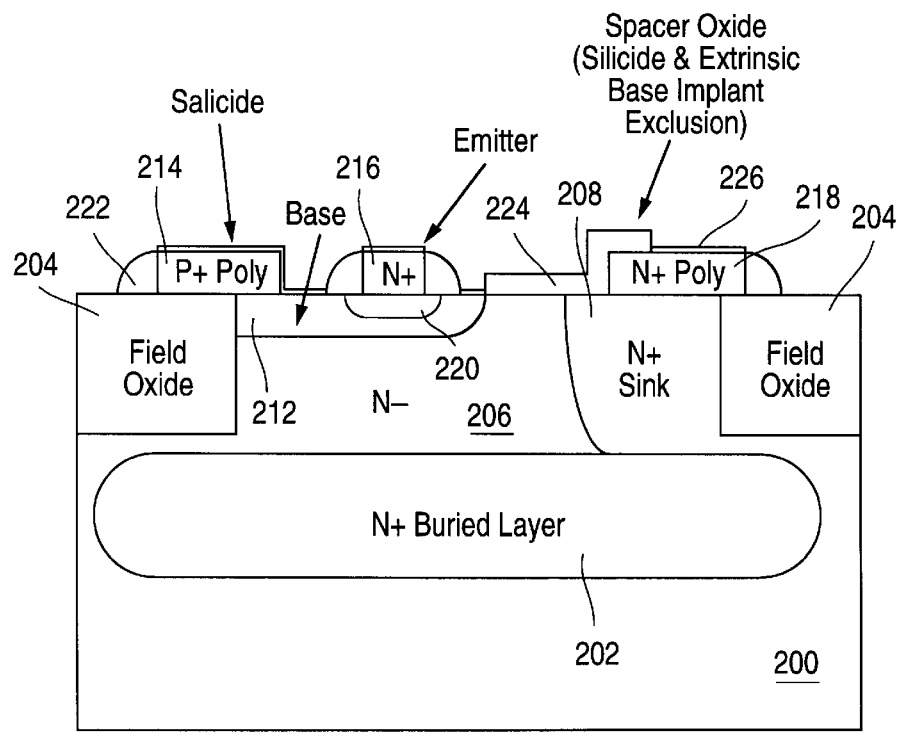

As shown in FIG. 2D, following a masked link base implant, a layer of spacer oxide is deposited and etched back to form oxide sidewall spacers 222 on the sidewalls of the raised poly regions 114, 116 and 118. It is noted that, unlike in the conventional FIGS. 1A–1E flow, the spacer oxide is patterned to provide a region 224 that excludes subsequent silicide formation on the area above the sink contact region 208. A P+ implant is then performed to provide the extrinsic base regions. A final anneal step is then performed to activate the dopants and salicide contact layers 226 are provided, resulting in the structure shown in FIG. 2E.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A single dielectric isolation region bipolar transistor structure comprising:

a buried layer having a first conductivity type formed in a semiconductor substrate;

an epitaxial layer having the first conductivity type formed on the buried layer, the epitaxial layer comprising a collector region of the bipolar transistor;

a single dielectric isolation region formed in the epitaxial layer surrounding a single substrate active device region, the substrate active device region having the first conductivity type;

a collector sink region having the first conductivity type formed in a first portion of the substrate active device region;

a base region having a second conductivity type opposite the first conductivity type formed in a second portion of the substrate active device region;

a conductive emitter region having the first conductivity type formed on a surface of the base region;

an emitter contact region having the first conductivity type formed in the base region beneath the conductive emitter region;

a first conductive contact element disposed in electrical contact with the base region, the first conductive contact element being spaced apart from the conductive emitter region;

a second conductive contact element disposed in electrical contact with the collector sink region, the second conductive contact element being spaced apart from the conductive emitter region; and an oxide spacer region formed to extend on the surface of the substrate active device region between the second conductive contact element and the conductive emitter region;

wherein the conductive emitter region, first conductive contact element and second conductive contact element lie entirely in the same horizontal plane.

2. A merged single polysilicon bipolar NPN transistor structure comprising:

an N+ buried layer formed in a silicon substrate;

an N– epitaxial layer formed on the buried layer;

a single oxide isolation region formed in the epitaxial layer surrounding a single N– substrate active device region;

an N+ sink region formed in the N– substrate active device region;

a P– base region formed in the substrate active device region, the P– base region being spaced apart from the N+ sink region;

an N+ polysilicon emitter region formed on a surface of the P– base region;

an N-type emitter contact region formed in the P– base region at an interface between the N+ polysilicon emitter region and the P– base region;

a first polysilicon contact region disposed in electrical contact with the P– base region, the first polysilicon contact region being spaced apart from the N+ polysilicon emitter region;

a second polysilicon contact region disposed in electrical contact with the N+ sink region, the second polysilicon contact region being spaced apart from the N+ polysilicon emitter region; and a silicon dioxide spacer region formed to extend on the surface of the substrate active device region between the second polysilicon contact region and the N+ polysilicon emitter region;

wherein the N+ polysilicon emitter region, first polysilicon contact region and second polysilicon contact region lie entirely in the same horizontal plane.

* * * * *